（12）United States Patent
Wang

(10) Patent No.: US 11,005,428 B2
(45) Date of Patent: May 11, 2021

(54) DIFFERENTIAL INPUT CIRCUIT, AMPLIFICATION CIRCUIT, AND DISPLAY APPARATUS

(71) Applicant: BOE TECHNOLOGY GROUP CO., LTD., Beijing (CN)

(72) Inventor: Tangxiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/771,289

(22) PCT Filed: Nov. 12, 2019

(86) PCT No.: PCT/CN2019/117509
§ 371 (c)(1),
(2) Date: Jun. 10, 2020

(87) PCT Pub. No.: WO2020/103725
PCT Pub. Date: May 28, 2020

(65) Prior Publication Data
US 2020/0395897 A1    Dec. 17, 2020

(30) Foreign Application Priority Data

Nov. 23, 2018  (CN) .......................... 201811409497.7

(51) Int. Cl.
*H03F 1/30* (2006.01)
*G09G 3/20* (2006.01)
(52) U.S. Cl.
CPC ............... *H03F 1/301* (2013.01); *G09G 3/20* (2013.01); *G09G 2310/0291* (2013.01); *G09G 2330/028* (2013.01)

(58) Field of Classification Search
CPC combination set(s) only.
See application file for complete search history.

(56) References Cited

U.S. PATENT DOCUMENTS 7,432,763 B2   10/2008   Leete
9,819,313 B2   11/2017   Deo
(Continued)

FOREIGN PATENT DOCUMENTS

CN      1528047 A      9/2004
CN      1612467 A      5/2005
(Continued)

OTHER PUBLICATIONS

International Search Report and Written Opinion dated Feb. 7, 2020 for PCT Patent Application No. PCT/CN2019/117509.
(Continued)

*Primary Examiner* — Van N Chow
(74) *Attorney, Agent, or Firm* — Thomas | Horstemeyer, LLP

(57) ABSTRACT

The present disclosure relates to a differential input circuit, an amplifier circuit, and a display device. The differential input circuit comprises: a first power module, a second power module, a first shunt module, a second shunt module, a first output module, and a second output module. The first power module is controlled to output a first signal, a second signal, and a third signal through a first bias signal, and the second power module receives the first signal, and outputs a fourth signal and a fifth signal through a differential input signal. The first shunt module, the second shunt module, the first output module, and the second output module are controlled by the differential input signal so that the first output module and the second output module output signals under the control of the differential input signal.

18 Claims, 4 Drawing Sheets

(56) References Cited

U.S. PATENT DOCUMENTS

| | | | |
|---|---|---|---|
| 2016/0112796 A1* | 4/2016 | Yang | H04R 3/00 381/122 |
| 2018/0269840 A1 | 9/2018 | Dandu et al. | |
| 2018/0332377 A1* | 11/2018 | Polo | H03F 3/45475 |
| 2019/0206503 A1* | 7/2019 | Zhang | G09G 3/20 |
| 2020/0194089 A1* | 6/2020 | Xu | G09G 3/3208 |

FOREIGN PATENT DOCUMENTS

| | | |
|---|---|---|
| CN | 101110575 A | 1/2008 |
| CN | 101510762 A | 8/2009 |
| CN | 101841309 A | 9/2010 |
| CN | 101997514 A | 3/2011 |
| CN | 102122925 A | 7/2011 |
| CN | 204465507 U | 7/2015 |
| CN | 106998194 A | 8/2017 |
| CN | 108631736 A | 10/2018 |
| CN | 109546981 A | 3/2019 |

OTHER PUBLICATIONS

1st Office Action dated Jan. 15, 2020 for Chinese Patent Application No. 201811409497.7.

\* cited by examiner

DIFFERENTIAL INPUT CIRCUIT, AMPLIFICATION CIRCUIT, AND DISPLAY APPARATUS

CROSS REFERENCE TO RELATED APPLICATIONS

The present application is based upon International Application No. PCT/CN2019/117509, filed on Nov. 12, 2019, which claims the benefit of and priority to Chinese Patent Application No. 201811409497.7, filed on Nov. 23, 2018, the contents of which being incorporated by reference in their entireties herein.

TECHNICAL FIELD

The present disclosure relates to the technical field of analog circuits and, in particular, to a differential input circuit, an amplifier circuit, and a display device.

BACKGROUND

With the development and advancement of technology, amplifiers are more and more widely used in analog circuits. In rail-to-rail amplifiers, a transconductance of a differential input circuit is related to a differential input voltage.

It should be noted that the information disclosed in the Background section above is only used to enhance the understanding of the background of the present disclosure and therefore, may include information that does not constitute the prior art known to those of ordinary skill in the art.

SUMMARY

An object of the present disclosure is to provide a differential input circuit, an amplifier circuit, and a display device.

According to a first aspect of the present disclosure, a differential input circuit is provided, including:

a first power sub-circuit, configured to output a first signal, a second signal, and a third signal under the control of a first bias signal, wherein the third signal is transmitted to a first node;

a second power sub-circuit, connected to the first power sub-circuit, receiving the first signal, and outputting a fourth signal and a fifth signal, wherein the fifth signal is transmitted to a second node;

a first shunt sub-circuit, connected to a fourth signal output terminal outputting the fourth signal, a differential input signal terminal, and the first node, and configured to transmit the fourth signal to the first node under the control of a differential input signal at the differential input signal terminal;

a second shunt sub-circuit, connected to a second signal output terminal outputting the second signal, the differential input signal terminal, and the second node, and configured to transmit the second signal to the second node under the control of the differential input signal at the differential input signal terminal;

a first output sub-circuit, connected to the differential input signal terminal, the first node, and a differential output terminal, and configured to output a first output signal under the control of the differential input signal at the differential input signal terminal;

a second output sub-circuit, connected to the differential input signal terminal, the second node and the differential output terminal, and configured to output a second output signal under the control of the differential input signal at the differential input signal terminal.

According to an embodiment of the present disclosure, the first power sub-circuit includes:

a first transistor, having a first terminal connected to a first power terminal, a control terminal connected to a first bias signal terminal, and a second terminal connected to the second power sub-circuit;

a second transistor, having a first terminal connected to the first power terminal, a control terminal connected to the first bias signal terminal, and a second terminal connected to the second shunt sub-circuit;

a third transistor, having a first terminal connected to the first power terminal, a control terminal connected to the first bias signal terminal, and a second terminal connected to the first output sub-circuit.

According to an embodiment of the present disclosure, a ratio of aspect ratios of the first transistor, the second transistor, and the third transistor is 4:3:4.

According to an embodiment of the present disclosure, the second power sub-circuit includes:

a fourth transistor, having a first terminal and a control terminal receiving the first signal, and a second terminal connected to a second power terminal;

a fifth transistor, having a first terminal connected to the first shunt sub-circuit, a control terminal connected to a first signal terminal, and a second terminal connected to the second power terminal;

a sixth transistor, having a first terminal connected to the second output sub-circuit, a control terminal connected to the first signal terminal, and a second terminal connected to the second power terminal.

According to an embodiment of the present disclosure, a ratio of aspect ratios of the fourth transistor, the fifth transistor, and the sixth transistor is 4:3:4.

According to an embodiment of the present disclosure, the first transistor, the second transistor, and the third transistor are P-type metal oxide semiconductor field effect transistors, and the fourth transistor, the fifth transistor, and the sixth transistor are N-type metal oxide semiconductor field effect transistors;

or the first transistor, the second transistor, and the third transistor are the N-type metal oxide semiconductor field effect transistors, and the four transistors, the fifth transistor, and the sixth transistor are the P-type metal oxide semiconductor field effect transistors.

According to an embodiment of the present disclosure, the differential input signal includes a first sub-differential signal and a second sub-differential signal, the first output signal includes a first output positive signal and a first output negative signal, and the second output signal includes a second output positive signal and a second output negative signal;

the first output sub-circuit includes:

a first differential transistor pair, including:

a seventh transistor, having a first terminal connected to the first node, a control terminal connected to the first sub-differential signal, and a second terminal outputting the first output positive signal;

an eighth transistor, having a first terminal connected to the first node, a control terminal connected to the second sub-differential signal, and a second terminal outputting the first output negative signal;

the second output sub-circuit includes:

a second differential transistor pair, including:

a ninth transistor, having a first terminal connected to the second node, a control terminal connected to the first sub-differential signal, and a second terminal outputs the second output positive signal;

a tenth transistor, having a first terminal connected to the second node, a control terminal connected to the second sub-differential signal, and a second terminal outputting the second output negative signal.

According to an embodiment of the present disclosure, the first shunt sub-circuit includes:

a third differential transistor pair, including:

an eleventh transistor, having a first terminal connected to the fourth signal output terminal, a control terminal connected to the first sub-differential signal, and a second terminal connected to the first node;

a twelfth transistor, having a first terminal connected to the fourth signal output terminal, a control terminal connected to the second sub-differential signal, and a second terminal connected to the first node;

the second shunt sub-circuit includes:

a fourth differential transistor pair, including:

a thirteenth transistor, having a first terminal connected to the second signal output terminal, a control terminal connected to the first sub-differential signal, and a second terminal connected to the second node;

a fourteenth transistor, having a first terminal connected to the second signal output terminal, a control terminal connected to the second sub-differential signal, and a second terminal connected to the second node.

According to an embodiment of the present disclosure, the seventh transistor, the eighth transistor, the thirteenth transistor, and the fourteenth transistor are the P-type metal oxide semiconductor field effect transistors, and the ninth transistor, the tenth transistor, and the eleventh transistor and a twelfth transistor are the N-type metal oxide semiconductor field effect transistors;

or the seventh transistor, the eighth transistor, the thirteenth transistor, and the fourteenth transistor are the N-type metal oxide semiconductor field effect transistors, and the ninth transistor, the tenth transistor, the eleventh transistor, and the twelfth transistor are the P-type metal oxide semiconductor field effect transistor.

According to an embodiment of the present disclosure, the second power sub-circuit is a current mirror power supply and can output a same current signal as the first power sub-circuit.

According to an embodiment of the present disclosure, the first power sub-circuit includes: a first transistor, having a first terminal connected to the first power terminal, a control terminal connected to the first bias signal terminal, and a second terminal connected to the second power sub-circuit; a second transistor, having a first terminal connected to the first power terminal, a control terminal connected to the first bias signal terminal, and a second terminal connected to the second shunt sub-circuit; a third transistor, having a first terminal connected to the first power terminal, a control terminal connected to the first bias signal terminal, and a second terminal connected to the first output sub-circuit, the second power sub-circuit includes: a fourth transistor, having a first terminal and a control terminal receiving the first signal, and a second terminal connected to the second power terminal; a fifth transistor, having a first terminal connected to the first shunt sub-circuit, a control terminal connected to the first signal terminal, and a second terminal connected to the second power terminal; a sixth transistor, having a first terminal connected to the second output sub-circuit, a control terminal connected to the first signal terminal, and a second terminal connected to the second power terminal, the first output sub-circuit comprises the first differential transistor pair, including: a seventh transistor, having a first terminal connected to the first node, a control terminal connected to the first sub-differential signal, and a second terminal outputting the first output signal; an eighth transistor, having a first terminal connected to the first node, a control terminal connected to the second sub-differential signal, and a second terminal outputting the first output signal, the second output sub-circuit includes the second differential transistor pair, including: a ninth transistor, having a first terminal connected to the second node, a control terminal connected to the first sub-differential signal, and a second terminal outputting the second output signal; a tenth transistor, having a first terminal connected to the second node, a control terminal connected to the second sub-differential signal, and a second terminal outputting the second output signal, the first shunt sub-circuit includes the third differential transistor pair, including: an eleventh transistor, having a first terminal connected to the fourth signal output terminal, a control terminal connected to the first sub-differential signal, and a second terminal connected to the first node; a twelfth transistor, having a first terminal connected to the fourth signal output terminal, a control terminal connected to the second sub-differential signal, and a second terminal connected to the first node, the second shunt sub-circuit includes the fourth differential transistor pair, including: a thirteenth transistor, having a first terminal connected to the second signal output terminal, a control terminal connected to the first sub-differential signal, and a second terminal connected to a second node; a fourteenth transistor, having a first terminal connected to the second signal output terminal, a control terminal connected to the second sub-differential signal, and a second terminal connected to the second node.

According to an embodiment of the present disclosure, the first transistor, the second transistor, the third transistor, the seventh transistor, the eighth transistor, the thirteenth transistor, and the fourteenth transistor are the P-type metal oxide semiconductor field effect transistors, and the fourth transistor, the fifth transistor, the sixth transistor, the ninth transistor, the tenth transistor, the eleventh transistor and the twelfth transistor are the N-type metal oxide semiconductor field effect transistors;

or the first transistor, the second transistor, the third transistor, the seventh transistor, the eighth transistor, the thirteenth transistor and the fourteenth transistor are the N-type metal oxide semiconductor field effect transistors, and the four transistors, the fifth transistor the sixth transistor, the ninth transistor, the tenth transistor, the eleventh transistor and the twelfth transistor are the P-type metal oxide semiconductor field effect transistors.

According to a second aspect of the present disclosure, there is provided an amplifier circuit, including the above-mentioned differential input circuit.

According to a third aspect of the present disclosure, there is provided a display device, including the above-mentioned amplifier circuit.

According to a fourth aspect of the present disclosure, there is provided a driving method of a differential input circuit for driving the differential input circuit according to the aforementioned aspect of the present disclosure, the method including:

controlling a first power module to output a first signal, a second signal and a third signal through a first bias signal, and a second power module receiving the first signal and outputting a fourth signal and a fifth signal;

controlling a first shunt module, a second shunt module, a first output module and a second output module by a differential input signal, to implement a constant transconductance of the differential input circuit, in response to the differential input signal changes.

According to an embodiment of the present disclosure, the first power sub-circuit includes: a first transistor, having a first terminal connected to the first power terminal, a control terminal connected to the first bias signal terminal, and a second terminal connected to the second power sub-circuit; a second transistor, having a first terminal connected to the first power terminal, a control terminal connected to the first bias signal terminal, and a second terminal connected to the second shunt sub-circuit; a third transistor, having a first terminal connected to the first power terminal, a control terminal connected to the first bias signal terminal, and a second terminal connected to the first output sub-circuit, the second power sub-circuit includes: a fourth transistor, having a first terminal and a control terminal receiving the first signal, and a second terminal connected to the second power terminal; a fifth transistor, having a first terminal connected to the first shunt sub-circuit, a control terminal connected to the first signal terminal, and a second terminal connected to the second power terminal; a sixth transistor, having a first terminal connected to the second output sub-circuit, a control terminal connected to the first signal terminal, and a second terminal connected to the second power terminal, the first output sub-circuit comprises the first differential transistor pair, including: a seventh transistor, having a first terminal connected to the first node, a control terminal connected to the first sub-differential signal, and a second terminal outputting the first output signal; an eighth transistor, having a first terminal connected to the first node, a control terminal connected to the second sub-differential signal, and a second terminal outputting the first output signal, the second output sub-circuit includes the second differential transistor pair, including: a ninth transistor, having a first terminal connected to the second node, a control terminal connected to the first sub-differential signal, and a second terminal outputting the second output signal; a tenth transistor, having a first terminal connected to the second node, a control terminal connected to the second sub-differential signal, and a second terminal outputting the second output signal, the first shunt sub-circuit includes the third differential transistor pair, including: an eleventh transistor, having a first terminal connected to the fourth signal output terminal, a control terminal connected to the first sub-differential signal, and a second terminal connected to the first node; a twelfth transistor, having a first terminal connected to the fourth signal output terminal, a control terminal connected to the second sub-differential signal, and a second terminal connected to the first node, the second shunt sub-circuit includes the fourth differential transistor pair, including: a thirteenth transistor, having a first terminal connected to the second signal output terminal, a control terminal connected to the first sub-differential signal, and a second terminal connected to a second node; a fourteenth transistor, having a first terminal connected to the second signal output terminal, a control terminal connected to the second sub-differential signal, and a second terminal connected to the second node.

the first transistor, the second transistor, the third transistor, the seventh transistor, the eighth transistor, the thirteenth transistor, and the fourteenth transistor are the P-type metal oxide semiconductor field effect transistors, and the fourth transistor, the fifth transistor, the sixth transistor, the ninth transistor, the tenth transistor, the eleventh transistor and the twelfth transistor are the N-type metal oxide semiconductor field effect transistors;

or the first transistor, the second transistor, the third transistor, the seventh transistor, the eighth transistor, the thirteenth transistor and the fourteenth transistor are the N-type metal oxide semiconductor field effect transistors, and the four transistors, the fifth transistor the sixth transistor, the ninth transistor, the tenth transistor, the eleventh transistor and the twelfth transistor are the P-type metal oxide semiconductor field effect transistors, the method further includes:

in a case where a voltage of the differential input signal is at a low level and a current output by the first transistor T1 under the control of the first bias signal is 8I, the N-type metal oxide semiconductor field effect transistor is turned off, and the P-type metal oxide semiconductor field effect transistor is turned on and is in a saturation region. In this case, the transconductance of the differential input circuit is $g_{mtot}=\sqrt{K_P 8I}$;

in a case where the voltage of the differential input signal is at a high level and the current output by the first transistor T1 under the control of the first bias signal is 8I, the N-type metal oxide semiconductor field effect transistor is turned on and is in the saturation region, the P-type metal oxide semiconductor field effect transistor is turned off. In this case, the transconductance of the differential input circuit is $g_{mtot}=\sqrt{K_N 8I}$;

in a case where the voltage of the differential input signal is at an intermediate level and the current output by the first transistor T1 under the control of the first bias signal is 8I, the N-type metal oxide semiconductor field effect transistor is turned on and is in the saturation region, the P-type metal oxide semiconductor field effect transistor is turned on and is in the saturation region. In this case, the transconductance of the differential input circuit is $g_{mtot}=\sqrt{K_P 2I}+\sqrt{K_N 2I}$, where, Kp and Kn are transconductance coefficients of the P-type metal oxide semiconductor field effect transistor and the N-type metal oxide semiconductor field effect transistor, respectively, and I is a reference value representing an output current of a transistor.

According to an embodiment of the present disclosure, the low level indicates that a differential input voltage is between 0 and Vthn+VB;

the intermediate level indicates that the differential input voltage is between Vthn+VB to VA+|Vthp|;

the high level indicates that the differential input voltage is between VA+|Vthp| to VDD;

where, Vthn represents a threshold voltage of the N-type metal oxide semiconductor field effect transistor, Vthp represents a threshold voltage of the P-type metal oxide semiconductor field effect transistor, VA represents a level of the first node, VB represents a level of the second node, and VDD represents a level of the first power terminal.

According to an embodiment of the present disclosure, size parameters of the P-type metal oxide semiconductor field effect transistor and the N-type metal oxide semiconductor field effect transistor are adjusted, so that $K_P=K_N$.

It should be understood that the above general description and the following detailed description are only exemplary and explanatory, and do not limit the present disclosure.

This section provides an overview of various implementations or examples of the technology described in this disclosure, and is not a comprehensive disclosure of the full scope or all features of the disclosed technology.

BRIEF DESCRIPTION OF THE DRAWINGS

The above and other features and advantages of the present disclosure will become more apparent by describing in detail example embodiments thereof with reference to the drawings.

DETAILED DESCRIPTION

Figure 1:
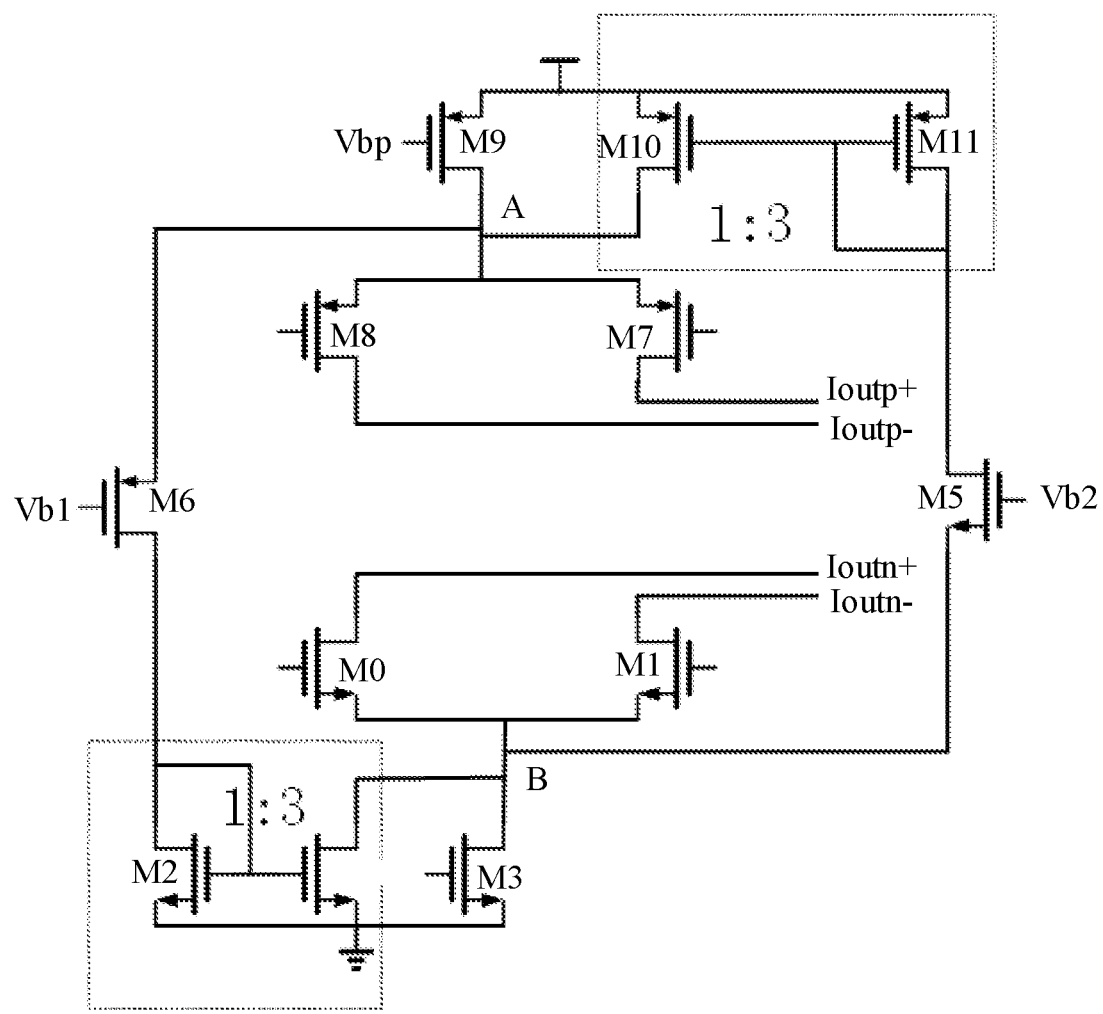
FIG. 1 is a schematic diagram of a differential output circuit with a constant transconductance provided by a comparative example of the present disclosure.

Example embodiments will now be described more fully with reference to the drawings. However, the exemplary embodiments can be implemented in various forms, and should not be construed as being limited to the embodiments set forth herein; on the contrary, providing these embodiments is such that the present disclosure will be comprehensive and complete and fully convey the idea of the exemplary embodiments for those skilled in the art. The same reference numerals in the drawings denote the same or similar parts, and thus their repeated description will be omitted.

Furthermore, the described features, structures, or characteristics may be combined in one or more embodiments in any suitable manner. In the following description, many specific details are provided to give a full understanding of the embodiments of the present disclosure. However, those skilled in the art will realize that the technical solutions of the present disclosure may be practiced without one or more of the specific details or other methods, components, materials, devices, steps, etc. may be used. In other instances, well-known structures, methods, devices, implementations, materials, or operations have not been shown or described in detail to avoid obscuring aspects of the present disclosure.

The block diagrams shown in the drawings are merely functional entities and do not necessarily have to correspond to physically independent entities. That is, these functional entities may be implemented in the form of software, or these functional entities or parts of functional entities may be implement in one or more software hardened modules, or these functional entities may be implemented in different networks and/or processor devices and/or microcontroller devices.

In a comparative example of the present disclosure, a constant transconductance circuit is to make the transconductance constant under different input voltages by changing a tail current of input pair, as shown in FIG. 1, M1 and M0 are NMOS (N-type metal oxide semiconductor field effect transistor) differential input pair, M7 and M8 are PMOS (P-type metal oxide semiconductor field effect transistor) differential input pairs, M4 and M9 are their current sources, and the circuit parameters are adjusted to make the tail current equal.

M5 and M6 are switch transistors, gate voltages of which are respectively Vb2 and Vb1, M2 and M3, M9 and M10 respectively form a triple (3-times) current mirror, and through switch control, a drain currents of M5 and M6 are amplified by 3 times to the source electrodes of the NMOS (N-type metal oxide semiconductor field effect transistor) differential input pair and the PMOS (P-type metal oxide semiconductor field effect transistor) differential input pair.

The operating principle is as follows: the input voltage in a range of rail to rail is a micro current of changed PMOS differential input pair and NMOS differential input pair changes drain current and thus changes transconductance, VA and VB are voltages of node A and node B, Vthn and Vthp are threshold voltages of the NMOS differential input pair and the PMOS differential input pair, respectively, and Itail refers to the tail current.

When the differential input voltage is between 0 and Vthn+VB, the NMOS differential input pair is cut off because Vgs is lower than Vthn, and the PMOS differential input pair is in a saturation region. A total input transconductance is: $g_{mtot}=\sqrt{K4I_{tail}}$;

when the differential input voltage is between Vthn+VB and VA+|Vthp|, both the NMOS differential input pair and PMOS differential input pair are turned on, and in this case, the total transconductance is: $g_{mtot}=\sqrt{KI_{tail}}+\sqrt{KI_{tail}}$;

when the differential input voltage is between VA+|Vthp| and VDD, the PMOS differential input pair is cut off because Vgs is lower than Vthp, and the NMOS differential input pair is in the saturation region. In this case, the transconductance is: $g_{mtot}=\sqrt{K4I_{tail}}$.

In this case, the transconductance of the input differential pair is constant in a full range, which is the principle of constant transconductance of the 3-times current mirror. However, the inventor found that in this structure, the gate voltages Vb1 and Vb2 that require 3-times switches of the tail current source have higher accuracy, which is more difficult to produce in the circuit, and under changes in manufacturing process, power supply voltage and temperature, a required voltage offset and a generated offset voltage are changing and in some extreme cases, the generated offset voltage may not meet circuit requirements, which will be extremely limit circuit performance. On the other hand, a single NMOS and PMOS are used as the current source, and when a common-mode input voltage changes, voltages at point A and point B will change the current value, and especially when the switch transistor is turned on, a drain voltage of the switch transistor is larger, and sometimes tail current source transistors M4 and M9 are forced into a linear region, which affects the current accuracy.

In addition, when the differential input voltage is at an intermediate value, the two switch transistors are required to be in an off state, and the drain current is small, switch channels are required to be long enough and a width-to-length ratio is small enough; and when the common-mode voltage of the input voltage is in an extreme case, the switch transistors are required to be turned on and an on-resistance is small enough, which requires the channels to be short enough and the width-to-length ratio to be large enough. This pair of contradictions is not easy to reconcile. In some circuit analyses, it is often found that the switch transistors are turned on and the drain voltage is too large, which causes the tail current source transistors to be in the linear region.

In summary, precise bias voltages Vb1 and Vb2 increase complexity of circuit design, and in some extreme process, environment, and power supply situations, the generated bias voltage may no longer meet the circuit requirements.

Figure 2:
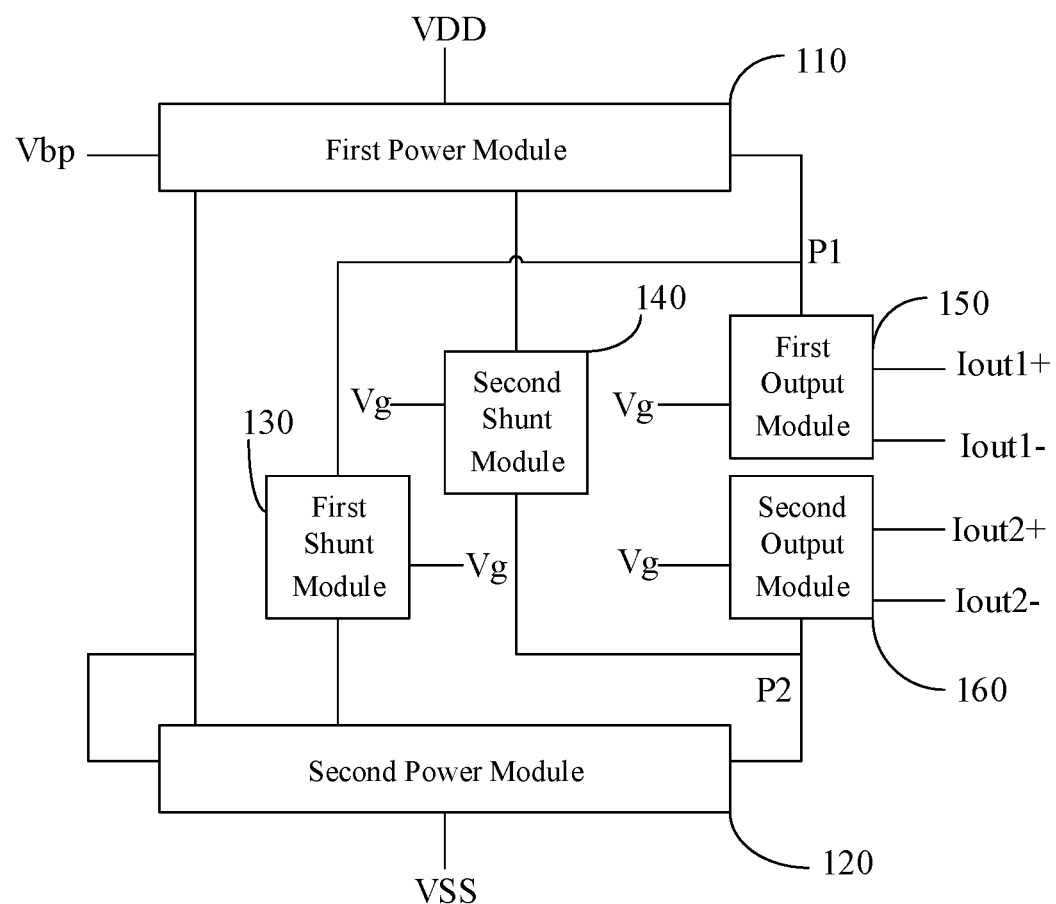
FIG. 2 is a schematic diagram of a differential input circuit provided by an exemplary embodiment of the present disclosure.

An exemplary embodiment of the present disclosure first provides a differential input circuit. As shown in FIG. 2, the differential input circuit includes:

a first power module 110, configured to output a first signal, a second signal, and a third signal under the control of a first bias signal Vbp, wherein the third signal is transmitted to a first node P1;

a second power module 120, connected to the first power module 110, receiving the first signal, and outputting a fourth signal and a fifth signal, wherein the fifth signal is transmitted to a second node P2;

a first shunt module 130, connected to a fourth signal output terminal, ae differential input signal Vg terminal and the first node P1, and configured to transmit the fourth signal to the first node P1 under the control of the differential input signal Vg;

a second shunt module 140, connected to a second signal output terminal, the differential input signal Vg terminal and the second node P2, and configured to transmit the second signal to the second node P2 under the control of the differential input signal Vg;

a first output module 150, connected to the differential input signal Vg terminal, the first node P1 and a differential output terminal, and configured to output a first output signal under the control of the differential input signal Vg, wherein the first output signal may include a first output positive current Iout1+ and a first output negative current Iout1−;

a second output module 160, connected to the differential input signal Vg terminal, the second node P2 and the differential output terminal, and configured to output a second output signal under the control of the differential input signal Vg, wherein the second output signal may include a second output positive current Iout2+ and a second output negative current Iout2−.

The second power module 120 is a current mirror power supply and can output a same current signal as the first power module 110. When a voltage of the differential input signal Vg is at a low level, the first output module 150 is turned on, the first shunt module 130 and the second output module 160 are turned off, and a differential signal is output through the first output module 150. When the differential input signal Vg is at a high level, the second output module 160 is turned on, the second shunt module 140 and the first output module 150 are turned off, and the differential signal is output through the second output module 160. By controlling own parameters of the first output module 150 and the second output module 160, a constant transconductance is achieved. When the differential input signal Vg is at an intermediate level, the first output module 150, the second output module 160, the first shunt module 130, and the second shunt module 140 are all turned on, and in this case, the first shunt module 130 shunts the third signal, and the shunted signal is output through the first output module 150; the second shunt module 140 shunts the fifth signal, and the shunted signal is output through the second output module 160 to achieve the constant transconductance under this condition.

In the differential input circuit provided by the present disclosure, the first power module 110 is controlled to output the first signal, the second signal and the third signal through the first bias signal Vbp, and the second power module 120 receives the first signal and outputs the fourth signal and the fifth signal; the first shunt module 130, the second shunt module 140, the first output module 150, and the second output module 160 is controlled through the differential input signal Vg, so that when the differential input signal Vg changes, the transconductance of the differential input circuit is constant, and since the first shunt module 130, the second shunt module 140, the first output module 150, and the second output module 160 are all controlled by the differential input signal Vg, there are few control signals, which makes the circuit control simple and easy to implement.

The modules of the differential input circuit provided by the embodiments of the present disclosure will be described in detail below.

Figure 3:
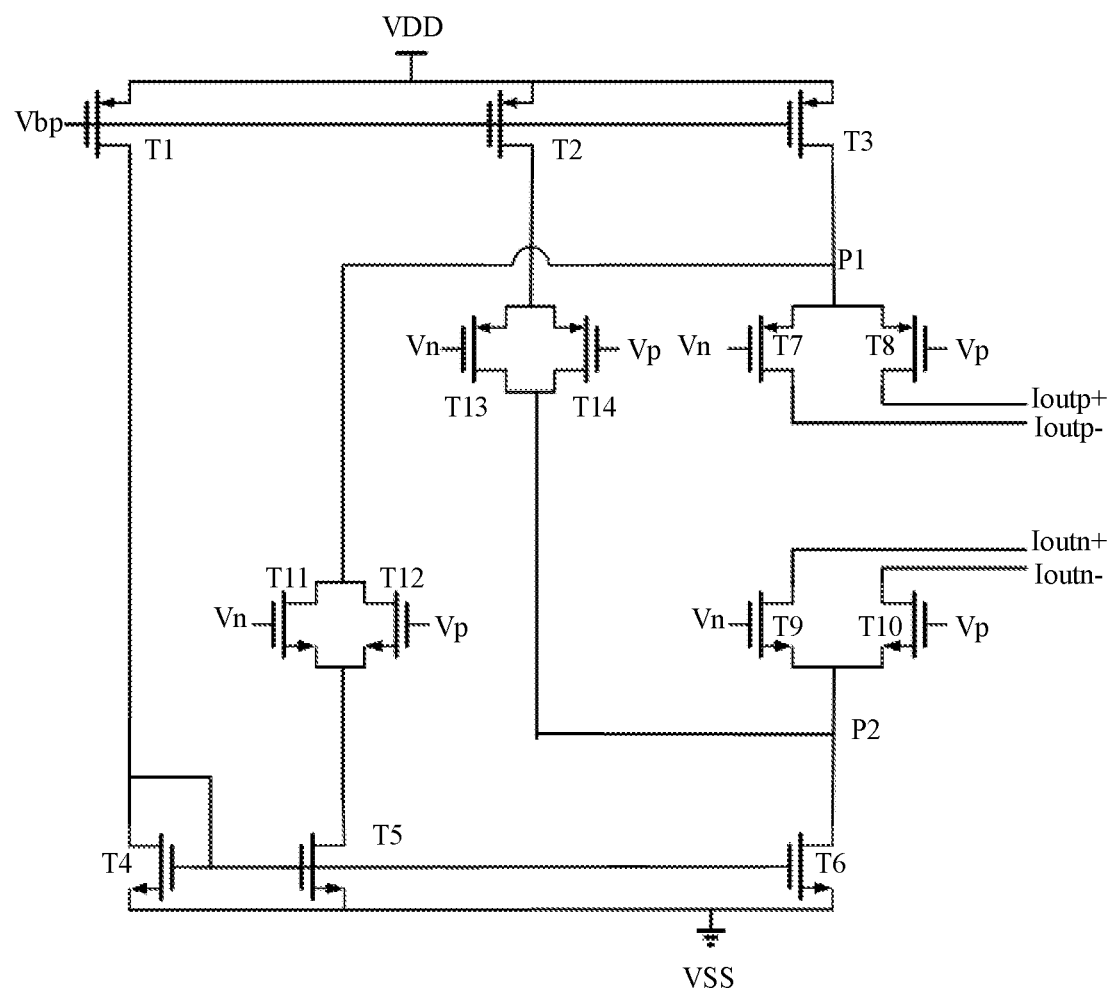
FIG. 3 is a schematic diagram of another differential input circuit provided by an exemplary embodiment of the present disclosure.

As shown in FIG. 3, the first power supply module 110 includes: a first transistor T1, a second transistor T2, and a third transistor T3; the first transistor T1 has a first terminal connected to a first power terminal VDD, a control terminal connected to the first bias signal Vbp terminal, and a second terminal connected to the second power module 120; the second transistor T2 has a first terminal connected to the first power terminal VDD, a control terminal connected to the first bias signal Vbp terminal, and a second terminal connected to the second shunt module 140; the third transistor T3 has a first terminal connected to the first power terminal VDD, a control terminal connected to the first bias signal Vbp terminal, and a second terminal connected to the first output module 150. A ratio of aspect ratios (width-to-length ratio, W/L) of the first transistor T1, the second transistor T2, and the third transistor T3 is 4:3:4.

The second power module 120 includes: a fourth transistor T4, a fifth transistor T5, and a sixth transistor T6; the fourth transistor T4 has a first terminal and a control terminal connected to a first signal output terminal, and a second terminal connected to a second power supply terminal VSS; the fifth transistor T5 has a first terminal connected to the first shunt module 130, a control terminal connected to a first signal terminal, and a second terminal connected to the second power terminal VSS; the sixth transistor T6 has a first terminal connected to the second output module 160, a control terminal connected to the first signal terminal, and a second terminal connected to the second power terminal VSS. A ratio of aspect ratios of the fourth transistor T4, the fifth transistor T5 and the sixth transistor T6 is 4:3:4.

The differential input signal Vg may include a first sub-differential signal Vn and a second sub-differential signal Vp; the first output module 150 is configured to output a first output current. Similar to the embodiment described with reference to FIG. 2, the first output current includes a first output positive current and a first output negative current. In this embodiment, the first output module 150 may be composed of PMOS, so the first output positive current and the first output negative current included in the first output current are marked as Ioutp+ and Ioutp−, respectively. Specifically, the first output module 150 may include a first differential transistor pair including a seventh transistor T7 and an eighth transistor T8; the seventh transistor T7 has a first terminal connected to the first node, a control terminal connected to the first sub-differential signal Vn, and a second end configured to output the first output positive current Iout+; the eighth transistor T8 has a first terminal connected to the first node, a control terminal connected to the second sub-differential signal Vp, and a second terminal configured to output the first output negative current Ioutp−.

The second output module 160 is configured to output a second output current. Similar to the embodiment described with reference to FIG. 2, the second output current includes a second output positive current and a second output negative current. In this embodiment, the second output module 160 may be composed of NMOS, and accordingly the second output positive current and the second output negative current included in the second output current are marked as Ioutp+ and Ioutp−, respectively. Specifically, the second output module 160 may include a second differential transistor pair including a ninth transistor T9 and a tenth transistor T10; the ninth transistor T9 has a first terminal connected to the second node, a control terminal connected to the first sub-differential signal Vn, and a second terminal configured to output the second output positive current Ioutn+; the tenth transistor T10 has a first terminal connected to the second node, a control terminal connected to the second sub-differential signal Vp, and a second terminal configured to output the second output negative current Ioutn−.

The first shunt module 130 includes a third differential transistor pair including: an eleventh transistor T11 and a twelfth transistor T12; the eleventh transistor T11 has a first terminal connected to a fourth signal output terminal, a control terminal connected to the first sub-differential signal Vn, and a second terminal connected to the first node; the twelfth transistor T12 has a first terminal connected to the fourth signal output terminal, a control terminal connected to the second sub-differential signal Vp, and a second terminal connected to the first node;

the second shunt module 140 includes a fourth differential transistor pair including: a thirteenth transistor T13 and a fourteenth transistor T14; the thirteenth transistor T13 has a first terminal connected to the second signal output terminal, a control terminal connected to the first sub-differential signal Vn, and a second terminal connected to the second node; the fourteenth transistor T14 has a first terminal connected to the second signal output terminal, a control terminal connected to the second sub-differential signal Vp, and a second terminal connected to the second node.

In a feasible implementation manner provided by an embodiment of the present disclosure, the seventh transistor T7, the eighth transistor T8, the thirteenth transistor T13, and the fourteenth transistor T14 are the PMOS, and the ninth transistor T9, the tenth transistor T10, the eleventh transistor T11 and the twelfth transistor T12 are the NMOS;

wherein, the seventh transistor T7, the eighth transistor T8, the thirteenth transistor T13 and the fourteenth transistor T14 may be the PMOS with same size, and the ninth transistor T9, the tenth transistor T10, the eleventh transistor T11 and the twelfth transistor T12 may be the NMOS with same size.

Since the ratio of the width-to-length ratio of the first transistor T1, the second transistor T2 and the third transistor T3 is 4:3:4, the ratio of the width-to-length ratio of the fourth transistor T4, the fifth transistor T5 and the sixth transistor T6 is 4:3:4. It is assumed that under the control of the first bias signal Vbp, the first transistor T1 outputs 8I current, the second transistor T2 outputs 6I current, the third transistor T3 outputs 8I current, and the second power module 120 is a current mirror power supply, so the fourth transistor T4 also outputs a current of 8I. In this embodiment, the parameter "I" represents a reference value of the output current of the transistor, which is determined by driving capability of the Vbp signal input in the previous stage, and may be, for example, 1 microampere, 2 microamperes, and so on.

When a common-mode voltage of the differential input signal is between 0 and Vthn+VP2, that is, when the voltage of the differential input signal Vg is at the low level, the NMOS is turned off, the PMOS is turned on and is in the saturation region, that is, the seventh transistor T7 and the eighth transistor T8 are turned on, and the ninth transistor T9, the tenth transistor T10, the eleventh transistor T11 and the twelfth transistor T12 are turned off. In this case, a total current flowing through the seventh transistor T7 and the eighth transistor T8 is 8I, and a current flowing through the nine transistor T9 and the tenth transistor T10 is zero. In this case, the transconductance of the differential input circuit is $g_{mtot}=\sqrt{K_P 8I}$, where, VP2 is a voltage at the second node P2 in FIG. 3, and Vthn is a threshold voltage of NMOS.

When the common-mode voltage of the differential input signal is between VP1+|Vthp| and VDD, that is, the voltage of the differential input signal Vg is at the high level, the PMOS is turned off, and the NMOS is turned on and is in the saturation region, that is, the ninth transistor T9 and the tenth transistor T10 are turned on, and the seventh transistor T7, the eighth transistor T8, the thirteenth transistor T13 and the fourteenth transistor T14 are turned off. In this case, a total current flowing through the ninth transistor T9 and the tenth transistor T10 is 8I, a current flowing through the seventh transistor T7 and the eighth transistor T8 is zero, and the transconductance of the differential input circuit is $g_{mtot}=\sqrt{K_N 8I}$, where, VP1 is a voltage at the first node P1 in FIG. 3, and Vthp is a threshold voltage of the PMOS.

When the common-mode voltage of the differential input signal is between Vthn+VP2 and VP1+|Vthp|, that is, the voltage of the differential input signal Vg is at the intermediate level, the NMOS pair and the PMOS pair are turned on at the same time and are in the saturation region, that is, the seventh transistor T7 to the fourteenth transistors T14 are all turned on. In this case, the first shunt module 130 shunts 6I of a current from the third transistor T3, the total current output by the first output module 150 is 2I, the second shunt module 140 shunts 6I of a current from the fifth transistor T5, the total current output by the second output module 160 is 2I, and the transconductance of the differential circuit is $g_{mtot}=\sqrt{K_P 2I}+\sqrt{K_N 2I}$. By adjusting the size parameters of NMOS and PMOS, Kp=Kn=K, so the transconductance of the differential input circuit in the above three stages are all $g_{mtot}=2\sqrt{K 2I}$, thereby implementing a constant transconductance in a rail-to-rail input range. In this embodiment, Kp and Kn represent proportionality coefficients of the PMOS and the NMOS, respectively, that is so-called transconductance coefficients. According to an embodiment of the present disclosure, Kp and Kn may be related to at least one of the following circuit size parameters and electrical parameters: carrier mobility, capacitance per unit area of the gate oxide layer, and width-to-length ratio of the transistor.

In another feasible implementation manner provided by an embodiment of the present disclosure, the seventh transistor T7, the eighth transistor T8, the thirteenth transistor T13, and the fourteenth transistor T14 are the NMOS, and the ninth transistor T9, the tenth transistor T10, the eleventh transistor T11 and the twelfth transistor T12 are the PMOS.

The first transistor T1, the second transistor T2 and the third transistor T3 may be the NMOS, and the fourth transistor T4, the fifth transistor T5 and the sixth transistor T6 may be the PMOS; or the first transistor T1, the second transistor T2 and the third transistor T3 may be the PMOS, and the fourth transistor T4, the fifth transistor T5, and the sixth transistor T6 may be the NMOS;

for each transistor, the control terminal may be a gate, the first terminal may be a source, and the second terminal may be a drain; or, the control terminal may be the gate, the first terminal may be the drain, and the second terminal may be the source. In addition, each transistor may also be an enhancement mode transistor or a depletion mode transistor, which is not specifically limited in this example embodiment.

The modules mentioned in the embodiments of the present disclosure may be understood as sub-circuits.

Figure 4:
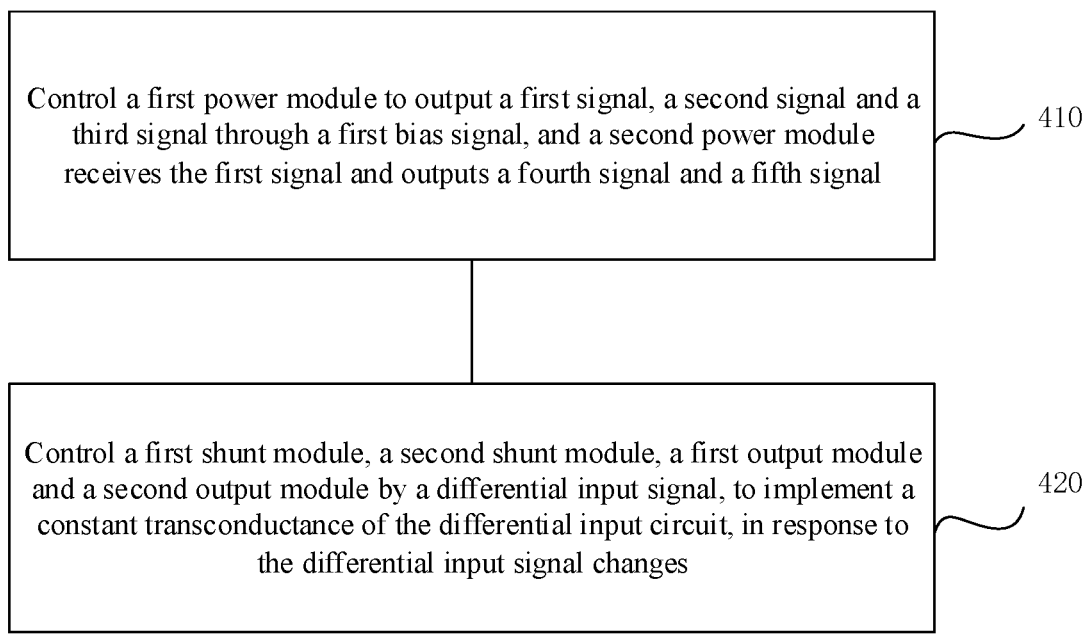
FIG. 4 is a schematic flowchart of a driving method for a differential input circuit according to an exemplary embodiment of the present disclosure.

The present disclosure also provides a driving method of a differential input circuit for driving the differential input circuit as described in any of the foregoing embodiments. Referring to FIG. 4, the driving method includes:

controlling a first power module 110 to output a first signal, a second signal and a third signal through a first bias signal Vbp, and a second power module 120 receiving the first signal and outputting a fourth signal and a fifth signal; controlling a first shunt module 130, a second shunt module 140, a first output module 150, and a second output module 160 through a differential input signal Vg, to implement a constant transconductance of the differential input circuit, in response to the differential input signal Vg changes; since the first shunt module 130, the second shunt module 140, the first output module 150, and the second output module 160 are all controlled by the differential input signal Vg, there are few control signals, which makes the circuit control simple and easy to implement.

A more specific description of each step of the driving method has been described in detail in the foregoing embodiment of the differential input circuit, so it will not be repeated here.

In the differential input circuit provided by the embodiment of the present disclosure, the first shunt module 130, the second shunt module 140, the first output module 150, and the second output module 160 are all controlled by the differential input signal Vg, which avoids that gate voltages Vb1 and Vb2 of the switch transistors of 3-times tail current source in the comparative example of the present disclosure have higher precision, resulting in a complicated control and difficult manufacture. Under changes in manufacturing process, power supply voltage and temperature, the required voltage offset and the generated offset voltage are changing. In some extreme cases, the generated offset voltage may not meet the circuit requirements, limiting problems of circuit performance. In addition, when a plurality of transistors are used as the current source, a single transistor is used as the current source, a voltage of the differential input signal Vg changes, a drain voltage of the switch is larger, which sometimes forces its tail current source to enter the linear region, which affects the current accuracy.

Exemplary embodiments of the present disclosure also provide an amplification circuit including the differential input circuit provided by the embodiments of the present disclosure. Of course, in practical applications, the amplifying circuit may also include components such as comparators, resistors, and encoding circuits, as they are all existing technologies and will not be repeated here.

Exemplary embodiments of the present disclosure also provide a display device including the amplification circuit provided by the embodiments of the present disclosure. The display device may include, for example, any product or component having a display function, such as a mobile phone, a tablet computer, a television, a notebook computer, a digital photo frame, and a navigator.

In the differential input circuit provided by the present disclosure, a first power module is controlled to output a first signal, a second signal and a third signal through a first bias signal, and a second power module receives the first signal and outputs a fourth signal and a fifth signal; a first shunt module, a second shunt module, a first output module and a second output module are controlled through a differential input signal, so that when the differential input signal changes, a transconductance of the differential input circuit is constant; and since the first shunt module, the second shunt module, the first output module and the second output module are all controlled by the differential input signal, there are few the control signals, which makes the circuit control simple and easy to implement, and simplifies the manufacturing process and saves the cost.

After considering the description and practicing the invention disclosed herein, those skilled in the art will easily think of other embodiments of the present disclosure. This application is intended to cover any variations, uses, or adaptive changes of the present disclosure that follow the general principles of the present disclosure and include common general knowledge or customary technical means in the technical field not disclosed in the present disclosure. The description and examples are to be considered exemplary only, and the true scope and spirit of this disclosure are pointed out by the claims.

It should be understood that the present disclosure is not limited to the precise structure that has been described above and shown in the drawings, and that various modifications and changes can be made without departing from the scope thereof. The scope of the present disclosure is limited only by the appended claims.

What is claimed is:

1. A differential input circuit, comprising:
   a first power sub-circuit configured to output a first signal, a second signal, and a third signal under control of a first bias signal, wherein the third signal is transmitted to a first node;
   a second power sub-circuit connected to the first power sub-circuit, receiving the first signal, and outputting a fourth signal and a fifth signal, wherein the fifth signal is transmitted to a second node;
   a first shunt sub-circuit connected to a fourth signal output terminal outputting the fourth signal, a differential input signal terminal, and the first node, and configured to transmit the fourth signal to the first node under control of a differential input signal at the differential input signal terminal;
   a second shunt sub-circuit connected to a second signal output terminal outputting the second signal, the differential input signal terminal, and the second node, and configured to transmit the second signal to the second node under control of the differential input signal at the differential input signal terminal;
   a first output sub-circuit connected to the differential input signal terminal, the first node, and a differential output terminal, and configured to output a first output signal under control of the differential input signal at the differential input signal terminal; and
   a second output sub-circuit connected to the differential input signal terminal, the second node, and the differential output terminal, and configured to output a second output signal under control of the differential input signal at the differential input signal terminal.

2. The differential input circuit according to claim 1, wherein the first power sub-circuit comprises:
   a first transistor having a first terminal connected to a first power terminal, a control terminal connected to a first bias signal terminal, and a second terminal connected to the second power sub-circuit;
   a second transistor having a first terminal connected to the first power terminal, a control terminal connected to the first bias signal terminal, and a second terminal connected to the second shunt sub-circuit; and a third transistor having a first terminal connected to the first power terminal, a control terminal connected to the first bias signal terminal, and a second terminal connected to the first output sub-circuit.

3. The differential input circuit according to claim 2, wherein a ratio of aspect ratios of the first transistor, the second transistor, and the third transistor is 4:3:4.

4. The differential input circuit according to claim 2, wherein the second power sub-circuit comprises:
a fourth transistor having a first terminal and a control terminal receiving the first signal, and a second terminal connected to a second power terminal;
a fifth transistor having a first terminal connected to the first shunt sub-circuit, a control terminal connected to a first signal terminal, and a second terminal connected to the second power terminal; and
a sixth transistor having a first terminal connected to the second output sub-circuit, a control terminal connected to the first signal terminal, and a second terminal connected to the second power terminal.

5. The differential input circuit according to claim 4, wherein a ratio of aspect ratios of the fourth transistor, the fifth transistor, and the sixth transistor is 4:3:4.

6. The differential input circuit according to claim 5, wherein:
the first transistor, the second transistor, and the third transistor are P-type metal oxide semiconductor field effect transistors, and the fourth transistor, the fifth transistor, and the sixth transistor are N-type metal oxide semiconductor field effect transistors; or
the first transistor, the second transistor, and the third transistor are the N-type metal oxide semiconductor field effect transistors, and the four transistors, the fifth transistor, and the sixth transistor are the P-type metal oxide semiconductor field effect transistors.

7. The differential input circuit according to claim 1, wherein:
the differential input signal comprises a first sub-differential signal and a second sub-differential signal, the first output signal comprises a first output positive signal and a first output negative signal, and the second output signal comprises a second output positive signal and a second output negative signal;
the first output sub-circuit comprises a first differential transistor pair, comprising:
a seventh transistor having a first terminal connected to the first node, a control terminal connected to the first sub-differential signal, and a second terminal outputting the first output positive signal; and
an eighth transistor having a first terminal connected to the first node, a control terminal connected to the second sub-differential signal, and a second terminal outputting the first output negative signal; and
the second output sub-circuit comprises a second differential transistor pair, comprising:
a ninth transistor having a first terminal connected to the second node, a control terminal connected to the first sub-differential signal, and a second terminal outputs the second output positive signal; and
a tenth transistor having a first terminal connected to the second node, a control terminal connected to the second sub-differential signal, and a second terminal outputting the second output negative signal.

8. The differential input circuit according to claim 7, wherein:
the first shunt sub-circuit comprises a third differential transistor pair, comprising:
an eleventh transistor having a first terminal connected to the fourth signal output terminal, a control terminal connected to the first sub-differential signal, and a second terminal connected to the first node; and
a twelfth transistor having a first terminal connected to the fourth signal output terminal, a control terminal connected to the second sub-differential signal, and a second terminal connected to the first node; and
the second shunt sub-circuit comprises a fourth differential transistor pair, comprising:
a thirteenth transistor having a first terminal connected to the second signal output terminal, a control terminal connected to the first sub-differential signal, and a second terminal connected to the second node; and
a fourteenth transistor having a first terminal connected to the second signal output terminal, a control terminal connected to the second sub-differential signal, and a second terminal connected to the second node.

9. The differential input circuit according to claim 8, wherein:
the seventh transistor, the eighth transistor, the thirteenth transistor, and the fourteenth transistor are the P-type metal oxide semiconductor field effect transistors, and the ninth transistor, the tenth transistor, and the eleventh transistor and a twelfth transistor are the N-type metal oxide semiconductor field effect transistors; or
the seventh transistor, the eighth transistor, the thirteenth transistor, and the fourteenth transistor are the N-type metal oxide semiconductor field effect transistors, and the ninth transistor, the tenth transistor, the eleventh transistor, and the twelfth transistor are the P-type metal oxide semiconductor field effect transistor.

10. The differential input circuit according to claim 1, wherein the second power sub-circuit is a current mirror power supply and can output a same current signal as the first power sub-circuit.

11. The differential input circuit according to claim 1, wherein:
the first power sub-circuit comprises: a first transistor having a first terminal connected to the first power terminal, a control terminal connected to the first bias signal terminal, and a second terminal connected to the second power sub-circuit; a second transistor having a first terminal connected to the first power terminal, a control terminal connected to the first bias signal terminal, and a second terminal connected to the second shunt sub-circuit; and a third transistor having a first terminal connected to the first power terminal, a control terminal connected to the first bias signal terminal, and a second terminal connected to the first output sub-circuit;
the second power sub-circuit comprises: a fourth transistor having a first terminal and a control terminal receiving the first signal, and a second terminal connected to the second power terminal; a fifth transistor having a first terminal connected to the first shunt sub-circuit, a control terminal connected to the first signal terminal, and a second terminal connected to the second power terminal; and a sixth transistor having a first terminal connected to the second output sub-circuit, a control terminal connected to the first signal terminal, and a second terminal connected to the second power terminal;
the first output sub-circuit comprises the first differential transistor pair, comprising: a seventh transistor having a first terminal connected to the first node, a control terminal connected to the first sub-differential signal, and a second terminal outputting the first output signal; and an eighth transistor having a first terminal connected to the first node, a control terminal connected to the second sub-differential signal, and a second terminal outputting the first output signal;

the second output sub-circuit comprises the second differential transistor pair, comprising: a ninth transistor having a first terminal connected to the second node, a control terminal connected to the first sub-differential signal, and a second terminal outputting the second output signal; and a tenth transistor having a first terminal connected to the second node, a control terminal connected to the second sub-differential signal, and a second terminal outputting the second output signal;

the first shunt sub-circuit comprises the third differential transistor pair, comprising: an eleventh transistor having a first terminal connected to the fourth signal output terminal, a control terminal connected to the first sub-differential signal, and a second terminal connected to the first node; and a twelfth transistor having a first terminal connected to the fourth signal output terminal, a control terminal connected to the second sub-differential signal, and a second terminal connected to the first node; and the second shunt sub-circuit comprises the fourth differential transistor pair, comprising: a thirteenth transistor having a first terminal connected to the second signal output terminal, a control terminal connected to the first sub-differential signal, and a second terminal connected to a second node; and a fourteenth transistor having a first terminal connected to the second signal output terminal, a control terminal connected to the second sub-differential signal, and a second terminal connected to the second node.

12. The differential input circuit according to claim 11, wherein:

the first transistor, the second transistor, the third transistor, the seventh transistor, the eighth transistor, the thirteenth transistor, and the fourteenth transistor are the P-type metal oxide semiconductor field effect transistors, and the fourth transistor, the fifth transistor, the sixth transistor, the ninth transistor, the tenth transistor, the eleventh transistor and the twelfth transistor are the N-type metal oxide semiconductor field effect transistors; or the first transistor, the second transistor, the third transistor, the seventh transistor, the eighth transistor, the thirteenth transistor and the fourteenth transistor are the N-type metal oxide semiconductor field effect transistors, and the four transistors, the fifth transistor the sixth transistor, the ninth transistor, the tenth transistor, the eleventh transistor and the twelfth transistor are the P-type metal oxide semiconductor field effect transistors.

13. An amplifier circuit, comprising:
a differential input circuit, comprising:
  a first power sub-circuit configured to output a first signal, a second signal, and a third signal under control of a first bias signal, wherein the third signal is transmitted to a first node;
  a second power sub-circuit connected to the first power sub-circuit, receiving the first signal, and outputting a fourth signal and a fifth signal, wherein the fifth signal is transmitted to a second node;
  a first shunt sub-circuit connected to a fourth signal output terminal outputting the fourth signal, a differential input signal terminal, and the first node, and configured to transmit the fourth signal to the first node under control of a differential input signal at the differential input signal terminal;
  a second shunt sub-circuit connected to a second signal output terminal outputting the second signal, the differential input signal terminal, and the second node, and configured to transmit the second signal to the second node under control of the differential input signal at the differential input signal terminal;
  a first output sub-circuit connected to the differential input signal terminal, the first node, and a differential output terminal, and configured to output a first output signal under control of the differential input signal at the differential input signal terminal; and
  a second output sub-circuit connected to the differential input signal terminal, the second node, and the differential output terminal, and configured to output a second output signal under control of the differential input signal at the differential input signal terminal.

14. The amplifier circuit according to claim 13, wherein the differential input circuit is implemented in a display device.

15. A driving method of a differential input circuit configured to drive the differential input circuit, comprising:
providing the differential input circuit, wherein the differential input circuit comprises:
  a first power sub-circuit configured to output a first signal, a second signal, and a third signal under control of a first bias signal, wherein the third signal is transmitted to a first node;
  a second power sub-circuit connected to the first power sub-circuit, receiving the first signal, and outputting a fourth signal and a fifth signal, wherein the fifth signal is transmitted to a second node;
  a first shunt sub-circuit connected to a fourth signal output terminal outputting the fourth signal, a differential input signal terminal, and the first node, and configured to transmit the fourth signal to the first node under control of a differential input signal at the differential input signal terminal;
  a second shunt sub-circuit connected to a second signal output terminal outputting the second signal, the differential input signal terminal, and the second node, and configured to transmit the second signal to the second node under control of the differential input signal at the differential input signal terminal;
  a first output sub-circuit connected to the differential input signal terminal, the first node, and a differential output terminal, and configured to output a first output signal under control of the differential input signal at the differential input signal terminal; and
  a second output sub-circuit connected to the differential input signal terminal, the second node, and the differential output terminal, and configured to output a second output signal under control of the differential input signal at the differential input signal terminal;
controlling a first power module to output a first signal, a second signal and a third signal through a first bias signal, and a second power module receiving the first signal and outputting a fourth signal and a fifth signal; and controlling a first shunt module, a second shunt module, a first output module and a second output module by a differential input signal to implement a constant transconductance of the differential input circuit in response to the differential input signal changes.

16. The method according to claim 15, wherein:
the first power sub-circuit comprises: a first transistor having a first terminal connected to the first power terminal, a control terminal connected to the first bias signal terminal, and a second terminal connected to the second power sub-circuit; a second transistor having a first terminal connected to the first power terminal, a control terminal connected to the first bias signal terminal, and a second terminal connected to the second shunt sub-circuit; and a third transistor having a first terminal connected to the first power terminal, a control terminal connected to the first bias signal terminal, and a second terminal connected to the first output sub-circuit;
the second power sub-circuit comprises: a fourth transistor having a first terminal and a control terminal receiving the first signal, and a second terminal connected to the second power terminal; a fifth transistor having a first terminal connected to the first shunt sub-circuit, a control terminal connected to the first signal terminal, and a second terminal connected to the second power terminal; and a sixth transistor having a first terminal connected to the second output sub-circuit, a control terminal connected to the first signal terminal, and a second terminal connected to the second power terminal;
the first output sub-circuit comprises the first differential transistor pair, comprising: a seventh transistor having a first terminal connected to the first node, a control terminal connected to the first sub-differential signal, and a second terminal outputting the first output signal; and an eighth transistor having a first terminal connected to the first node, a control terminal connected to the second sub-differential signal, and a second terminal outputting the first output signal;
the second output sub-circuit comprises the second differential transistor pair, comprising: a ninth transistor having a first terminal connected to the second node, a control terminal connected to the first sub-differential signal, and a second terminal outputting the second output signal; and a tenth transistor having a first terminal connected to the second node, a control terminal connected to the second sub-differential signal, and a second terminal outputting the second output signal;
the first shunt sub-circuit comprises the third differential transistor pair, comprising: an eleventh transistor having a first terminal connected to the fourth signal output terminal, a control terminal connected to the first sub-differential signal, and a second terminal connected to the first node; and a twelfth transistor having a first terminal connected to the fourth signal output terminal, a control terminal connected to the second sub-differential signal, and a second terminal connected to the first node;
the second shunt sub-circuit comprises the fourth differential transistor pair, comprising: a thirteenth transistor having a first terminal connected to the second signal output terminal, a control terminal connected to the first sub-differential signal, and a second terminal connected to a second node; and a fourteenth transistor having a first terminal connected to the second signal output terminal, a control terminal connected to the second sub-differential signal, and a second terminal connected to the second node;
wherein:
the first transistor, the second transistor, the third transistor, the seventh transistor, the eighth transistor, the thirteenth transistor, and the fourteenth transistor are P-type metal oxide semiconductor field effect transistors, and the fourth transistor, the fifth transistor, the sixth transistor, the ninth transistor, the tenth transistor, the eleventh transistor, and the twelfth transistor are N-type metal oxide semiconductor field effect transistors; or
the first transistor, the second transistor, the third transistor, the seventh transistor, the eighth transistor, the thirteenth transistor, and the fourteenth transistor are the N-type metal oxide semiconductor field effect transistors, and the forth transistor, the fifth transistor, the sixth transistor, the ninth transistor, the tenth transistor, the eleventh transistor, and the twelfth transistor are the P-type metal oxide semiconductor field effect transistors,
wherein the method further comprises:
in a case where a voltage of the differential input signal is at a low level and a current output by the first transistor T1 under the control of the first bias signal is 8I, the N-type metal oxide semiconductor field effect transistor is turned off, and the P-type metal oxide semiconductor field effect transistor is turned on and is in a saturation region, in this case, the transconductance of the differential input circuit is $g_{mtot}=\sqrt{K_P 8I}$;
in a case where the voltage of the differential input signal is at a high level and the current output by the first transistor T1 under the control of the first bias signal is 8I, the N-type metal oxide semiconductor field effect transistor is turned on and is in the saturation region, the P-type metal oxide semiconductor field effect transistor is turned off. In this case, the transconductance of the differential input circuit is $g_{mtot}=\sqrt{K_N 8I}$; and
in a case where the voltage of the differential input signal is at an intermediate level and the current output by the first transistor T1 under the control of the first bias signal is 8I, the N-type metal oxide semiconductor field effect transistor is turned on and is in the saturation region, the P-type metal oxide semiconductor field effect transistor is turned on and is in the saturation region. In this case, the transconductance of the differential input circuit is $g_{mtot}=\sqrt{K_P 2I}+\sqrt{K_N 2I}$,
where, Kp and Kn are transconductance coefficients of the P-type metal oxide semiconductor field effect transistor and the N-type metal oxide semiconductor field effect transistor, respectively, and I is a reference value representing an output current of a transistor.

17. The method according to claim 16, wherein:
the low level indicates that a differential input voltage is between 0 and Vthn+VB;
the intermediate level indicates that the differential input voltage is between Vthn+VB to VA+|Vthp|; and
the high level indicates that the differential input voltage is between VA+|Vthp| to VDD;
where, Vthn represents a threshold voltage of the N-type metal oxide semiconductor field effect transistor, Vthp represents a threshold voltage of the P-type metal oxide semiconductor field effect transistor, VA represents a level of the first node, VB represents a level of the second node, and VDD represents a level of the first power terminal.

18. The method according to claim 16, wherein size parameters of the P-type metal oxide semiconductor field effect transistor and the N-type metal oxide semiconductor field effect transistor are adjusted, so that $K_P=K_N$.

* * * * *